United States Patent
Sugiyama

(10) Patent No.: US 8,305,149 B2
(45) Date of Patent: Nov. 6, 2012

(54) SEMICONDUCTOR CIRCUIT APPARATUS AND DELAY DIFFERENCE CALCULATION METHOD

(75) Inventor: Itsumi Sugiyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 1 day.

(21) Appl. No.: 12/562,563

(22) Filed: Sep. 18, 2009

(65) Prior Publication Data

US 2010/0079212 A1 Apr. 1, 2010

(30) Foreign Application Priority Data

Oct. 1, 2008 (JP) ................................ 2008-256375

(51) Int. Cl.
*H03K 3/03* (2006.01)
*G01R 31/27* (2006.01)
(52) U.S. Cl. ........ 331/57; 331/44; 324/520; 324/762.09
(58) Field of Classification Search ............... 331/57, 331/44; 324/520, 762.09, 76.39, 76.41
See application file for complete search history.

(56) References Cited

U.S. PATENT DOCUMENTS

| 6,011,444 A | 1/2000 | Takada et al. | |
|---|---|---|---|
| 6,310,523 B1 * | 10/2001 | Chen et al. | 331/57 |
| 7,532,078 B2 * | 5/2009 | Agarwal et al. | 331/57 |
| 7,548,127 B2 * | 6/2009 | Morini et al. | 331/57 |

FOREIGN PATENT DOCUMENTS

| JP | 2004-56561 | 2/2004 |
|---|---|---|
| JP | 3779445 | 5/2006 |

* cited by examiner

*Primary Examiner* — Ryan Johnson
(74) *Attorney, Agent, or Firm* — Staas & Halsey LLP

(57) ABSTRACT

A semiconductor circuit apparatus having a clock oscillating circuit includes a first inverter circuit having a power supply terminal connected to a power supply potential via a first power supply potential connection transistor and a ground terminal connected to a ground potential via a first ground potential connection transistor, an inverter circuit block having a second inverter circuit connected to the power supply potential via a second power supply potential connection transistor and to the ground potential via a second ground potential connection transistor and connected to the first inverter circuit in parallel and a selection circuit block that outputs a power supply potential connection signal to any one of gate terminals of the first and second power supply potential connection transistors and a ground potential connection signal to any one of gate terminals of the first and second ground potential connection transistors.

9 Claims, 10 Drawing Sheets

# SEMICONDUCTOR CIRCUIT APPARATUS AND DELAY DIFFERENCE CALCULATION METHOD

CROSS-REFERENCE TO RELATED APPLICATIONS

This application is based upon and claims priority to prior Japanese Patent Application No. 2008-256375 filed on Oct. 1, 2008 in the Japan Patent Office, the entire contents of which are incorporated herein by reference.

BACKGROUND

1. Field

Embodiments of the present invention relate to a semiconductor circuit apparatus and a delay difference calculation method.

2. Description of the Related Art

LSIs (Large Scale Integrated circuits) used in an information processing apparatus may have different circuit characteristics due to differences of transistor characteristics. Differences of transistor characteristics result from fluctuations in a semiconductor chip caused by variable factors during manufacturing of the semiconductor chip. Manufacturing fluctuations may occur in a semiconductor chip even if circuits have the same circuit configuration in the same semiconductor chip. While LSIs are normally designed by allowing for manufacturing fluctuations in the semiconductor chip in advance, fluctuations estimated when designed use values determined by investigating characteristics of many transistors by taking many man-hours when a manufacturing process is initiated. Fluctuations in a semiconductor chip increase with finer structures and higher integration of transistors, making the LSI design more difficult.

FIG. 9 illustrates a conventional ring oscillator used for measurement of transistor characteristics of a LSI. A ring oscillator 40 illustrated in FIG. 9A has odd inverters 60 connected in series in a ring shape. Oscillation occurs by logic reversal in odd stages. A ring oscillator 40A illustrated in FIG. 9B has a negative AND (NAND) circuit 50 to control the start and stop of oscillation, instead of a portion of inverters.

If the delay time of a one-stage inverter (delay circuit) is t and the number of stages of inverters is n, an oscillating frequency f of such a ring oscillator is determined as: f=1/(2× t×n). If transistors constituting a ring oscillator have different characteristics, the delay time changes and the oscillating frequency also changes. By observing the oscillating frequency for each of a plurality of ring oscillators, differences in transistor characteristics of each ring oscillator can be observed.

Here, FIG. 10 illustrates an arrangement example of ring oscillators 40 to measure fluctuations inside a LSI. Conventionally, as depicted in FIG. 10, a plurality of identical ring oscillators is mounted and arranged inside a LSI 200 to measure fluctuations inside a chip by comparing oscillating frequencies in units of ring oscillators.

Conventional ring oscillators can determine fluctuations between LSIs by measuring oscillating frequencies of ring oscillators in each LSI. Fluctuations in transistor characteristics inside a LSI can be determined by arranging a plurality of ring oscillators inside the LSI as fluctuations between ring oscillators. However, fluctuations for each transistor or those of transistors by being separated into P-type transistors/N-type transistors cannot be determined. Even if a plurality of ring oscillators is arranged inside a LSI and frequencies are compared, a plurality of transistors constituting a ring oscillator as a whole is compared. Therefore, how transistor characteristics of each transistor are distributed is unknown, and only average characteristics of transistors constituting ring oscillators may be compared. A useful average case is to know an overall trend and in a case of inside a LSI, for example, when it is desired to know whether LSI characteristics change between a perimeter and a central part of the LSI.

As a conventional technique related to the present invention, an oscillating frequency correction circuit enabling auto corrections of an oscillating frequency of a ring oscillator contained in a semiconductor integrated circuit without the need for any external oscillator is disclosed. Also, a voltage control oscillating circuit capable of maintaining the oscillation gain constant to obtain highly stable oscillating frequencies with low jitter is disclosed.

[Patent Document 1] Japanese Laid-Open Patent Publication No. 2004-56561

[Patent Document 2] Japanese Patent No. 3779445

SUMMARY

According to an aspect of an invention, a semiconductor circuit apparatus having a clock oscillating circuit includes a first inverter circuit having a power supply terminal connected to a power supply potential via a first power supply potential connection transistor and a ground terminal connected to a ground potential via a first ground potential connection transistor, an inverter circuit block having a second inverter circuit connected to the power supply potential via a second power supply potential connection transistor and to the ground potential via a second ground potential connection transistor and connected to the first inverter circuit in parallel and a selection circuit block that outputs a power supply potential connection signal to any one of gate terminals of the first and second power supply potential connection transistors and a ground potential connection signal to any one of gate terminals of the first and second ground potential connection transistors.

The above-described embodiments of the present invention are intended as examples, and all embodiments of the present invention are not limited to including the features described above.

DETAILED DESCRIPTION OF THE PREFERRED EMBODIMENTS

Figure 1:
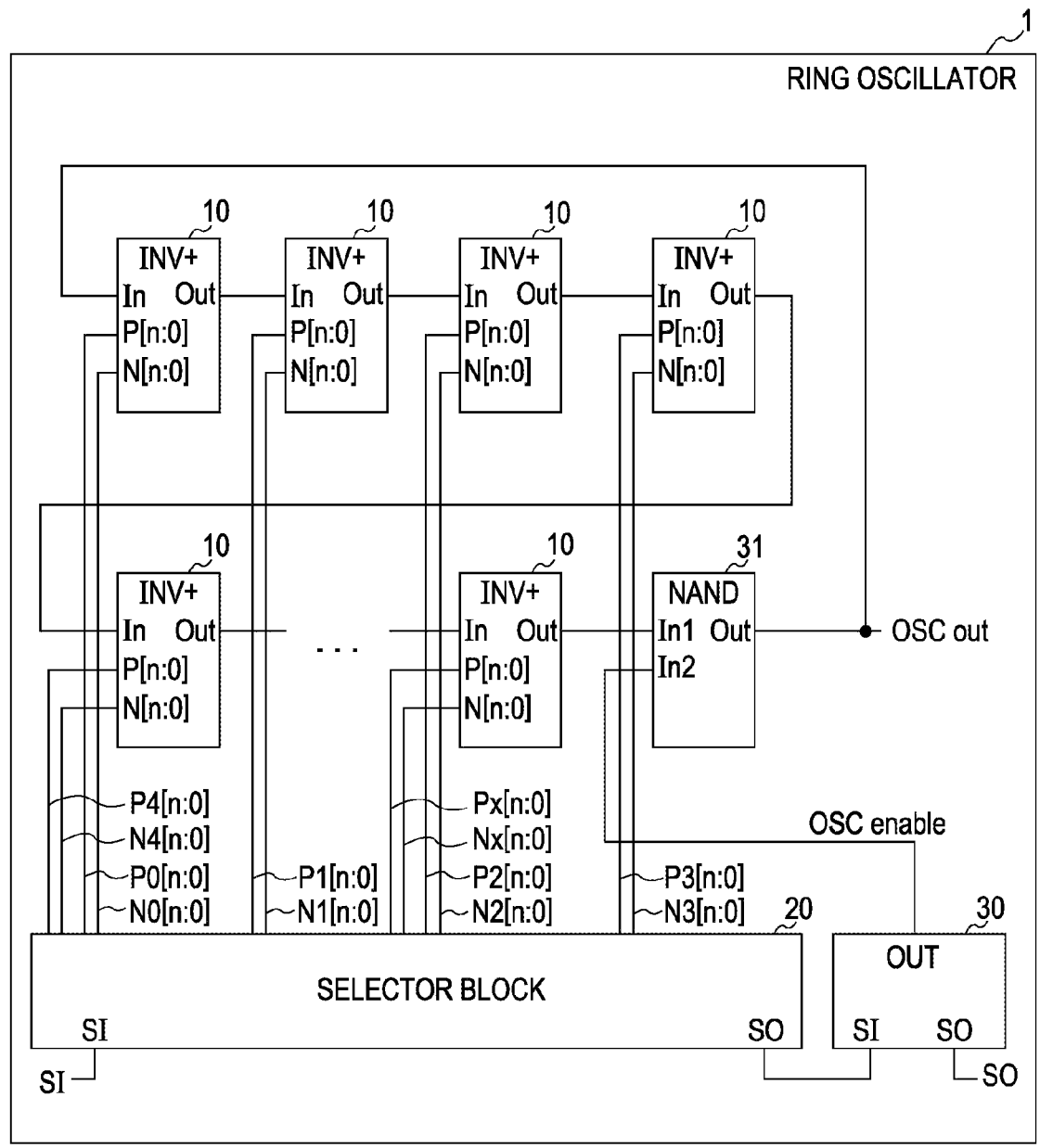
FIG. 1 is a configuration diagram exemplifying a ring oscillator with a NAND circuit according to embodiments.

Reference may now be made in detail to embodiments of the present invention, examples of which are illustrated in the accompanying drawings, wherein like reference numerals refer to like elements throughout.

First, an overview of an embodiment will be provided.

The present embodiment provides a circuit capable of easily acquiring data for measurement of fluctuations inside an LSI. The data is acquired by mounting ring oscillators capable of measuring fluctuations inside the LSI and repeating measurements of oscillating frequencies while changing a selection of transistors constituting the ring oscillators.

A ring oscillator according to the present embodiment is configured by connecting a plurality of inverter blocks in a ring form. Each of the inverter blocks includes an inverter circuit with a circuit to isolate a power supply and a ground connected in parallel. Isolation from the power supply and ground is controlled by a transistor selection setting circuit and, among inverters connected in parallel, one P-type transistor and one N-type transistor are independently selected. Further, the selection of transistors is independently made in each stage of inverter blocks.

Oscillating frequencies of ring oscillators are measured by successively switching the P-type transistor in some stage. Accordingly, fluctuations in measured frequency result from switching of the P-type transistors. A distribution of fluctuations of P-type characteristics can be obtained by switching all P-type transistors in one stage of inverter blocks. By making this measurement for all stages of inverter blocks, as many distributions of fluctuations as the number of stages are obtained. Though relationships between distributions of stages are not exactly determined, if a sufficiently large number of transistors to be switched in one stage are secured, the average of one stage is near the center of fluctuations inside the LSI and thus, distributions of all stages can be obtained by using the average of one stage for normalization and superimposing the distribution of each stage. Accordingly, a distribution of fluctuations inside the LSI of P-type transistor characteristics can be obtained. This can also be done similarly for N-type transistors.

Fluctuations inside a chip include a shape dependent fluctuation component and a random fluctuation component. The shape dependent fluctuation component is due to an influence of adjacent device shapes during pattern exposure or the like and the random fluctuation component is due to density distribution inside a channel of impurities or the like. Random fluctuations need to be considered particularly when a forecast is difficult to make and a margin needs to be taken into consideration during designing. In the present embodiment, only random fluctuations can be extracted by excluding shape dependent fluctuations from the distribution of measurement results of each stage if possible by providing the same ring shape in each stage.

Next, a concrete example of the present embodiment will be described.

First, FIG. 1 illustrates a configuration of a whole ring oscillator. A ring oscillator 1 (clock oscillating circuit) illustrated in FIG. 1 has inverter blocks 10 (inverter circuit blocks) (denoted in the drawing as "INV+") in which transistors can be switched and connected in series in even stages. The ring oscillator 1 includes a selector block 20 (selection circuit block) that outputs a transistor switching signal to each of the inverter blocks 10. Output terminals of the selector block 20 are connected to each of the inverter blocks 10.

An output terminal Out in the last stage of the inverter block 10 (first inverter circuit block) is connected to one input terminal In1 of a NAND circuit 31. Oscillation occurs when an output signal of the NAND circuit 31 returns to the inverter block 10 in the first stage (second inverter block). A clock oscillation inhibition signal output from a scan latch 30 (latch for setting a clock oscillation inhibition signal) set by scan-shift operation is input into the other input terminal In2 of the NAND circuit 31. Oscillation is started by "1" being input to the clock oscillation inhibition signal. A clock is output from the output terminal Out of the NAND circuit 31. From the viewpoint of securing measurement accuracy, it is desirable that the number of stages of the inverter blocks 10 constituting the ring oscillator 1 is as small as possible within the range in which oscillating frequencies can be counted because a change in oscillating frequency caused by fluctuations is thereby made larger.

Figure 2:
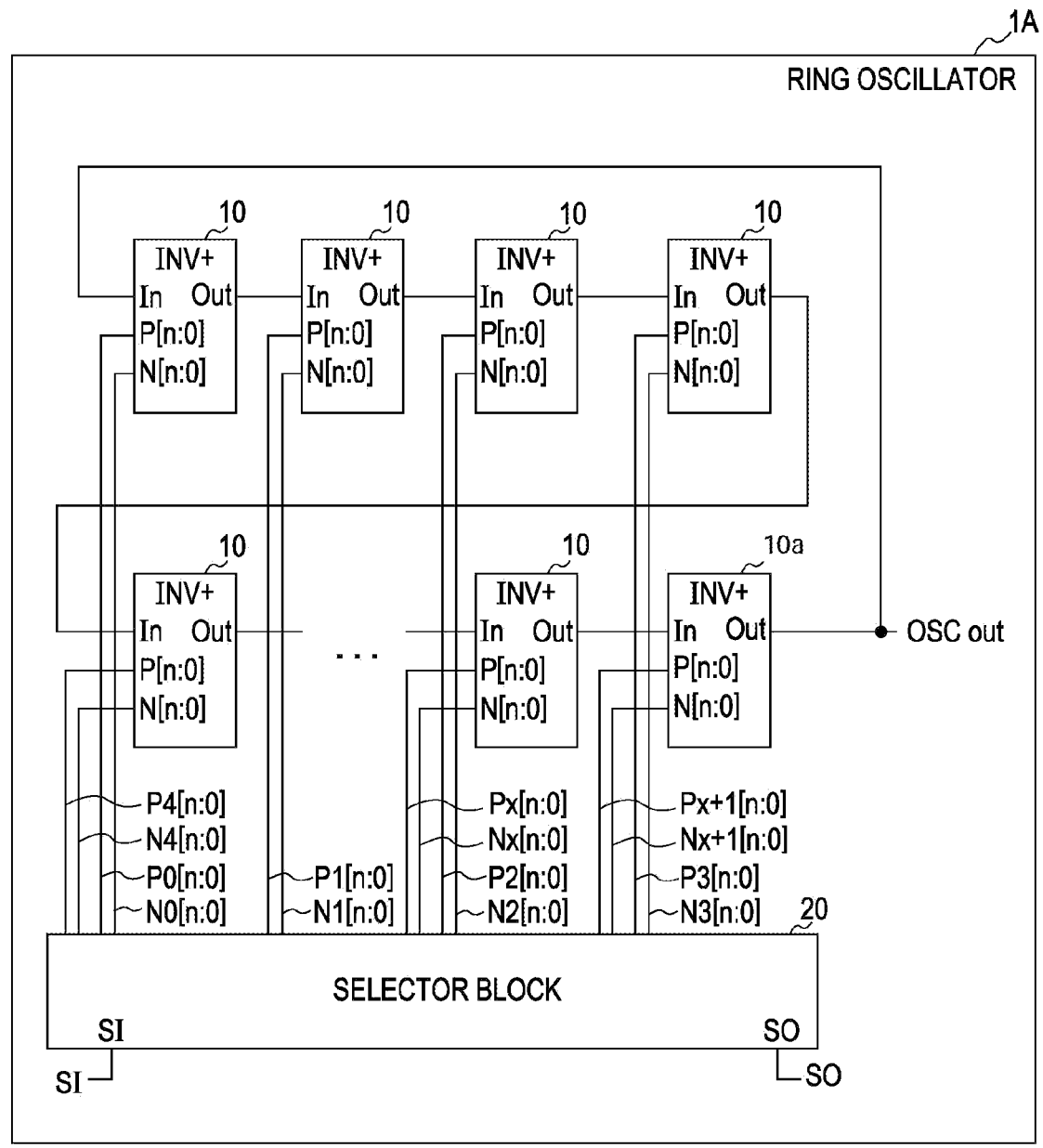
FIG. 2 is a configuration diagram exemplifying a ring oscillator without NAND circuit according to embodiments.

The ring oscillator 1 illustrated in FIG. 1 uses the NAND circuit 31 for oscillation control, but the NAND circuit 31 is not necessarily needed. FIG. 2 illustrates an example of the configuration of a ring oscillator that does not use the NAND circuit 31. A ring oscillator 1A includes an inverter block 10a, instead of the NAND circuit 31. The inverter blocks 10, including inverter block 10a, are connected in series in a ring shape so that odd stages are formed as a whole. While the description that follows refers to the ring oscillator 1 illustrated in FIG. 1, the description is also applicable to the ring oscillator 1 A illustrated in FIG. 2.

Next, an internal circuit configuration of the inverter block 10 connected in series inside the ring oscillator 1 will be described with reference to FIG. 3. The inverter block 10 is formed by a plurality of inverters 11 (a first inverter circuit and a second inverter circuit) (denoted in the drawing as "INV") in which transistors can be switched being connected in parallel. The input terminal and output terminal of each of the inverters 11 are connected to the input terminal and output terminal of the inverter block 10 respectively. Transistor switching signals to isolate transistors of the inverter from the power supply/ground come from the selector block 20 (shown in FIG. 2) for each of the inverters 11 by being separated into signals for P-type transistors (P[0], P[1], . . . , P[n]) and those for N-type transistors (N[0], N[1], . . . , N[n]).

Among the plurality of inverters 11 connected in parallel, a P-type transistor of one inverter and an N-type transistor of one inverter are selected by transistor switching signals. An example of transistor selection inside the inverter block 10 will be described later using a minimum configuration of the inverter block.

Figure 3:
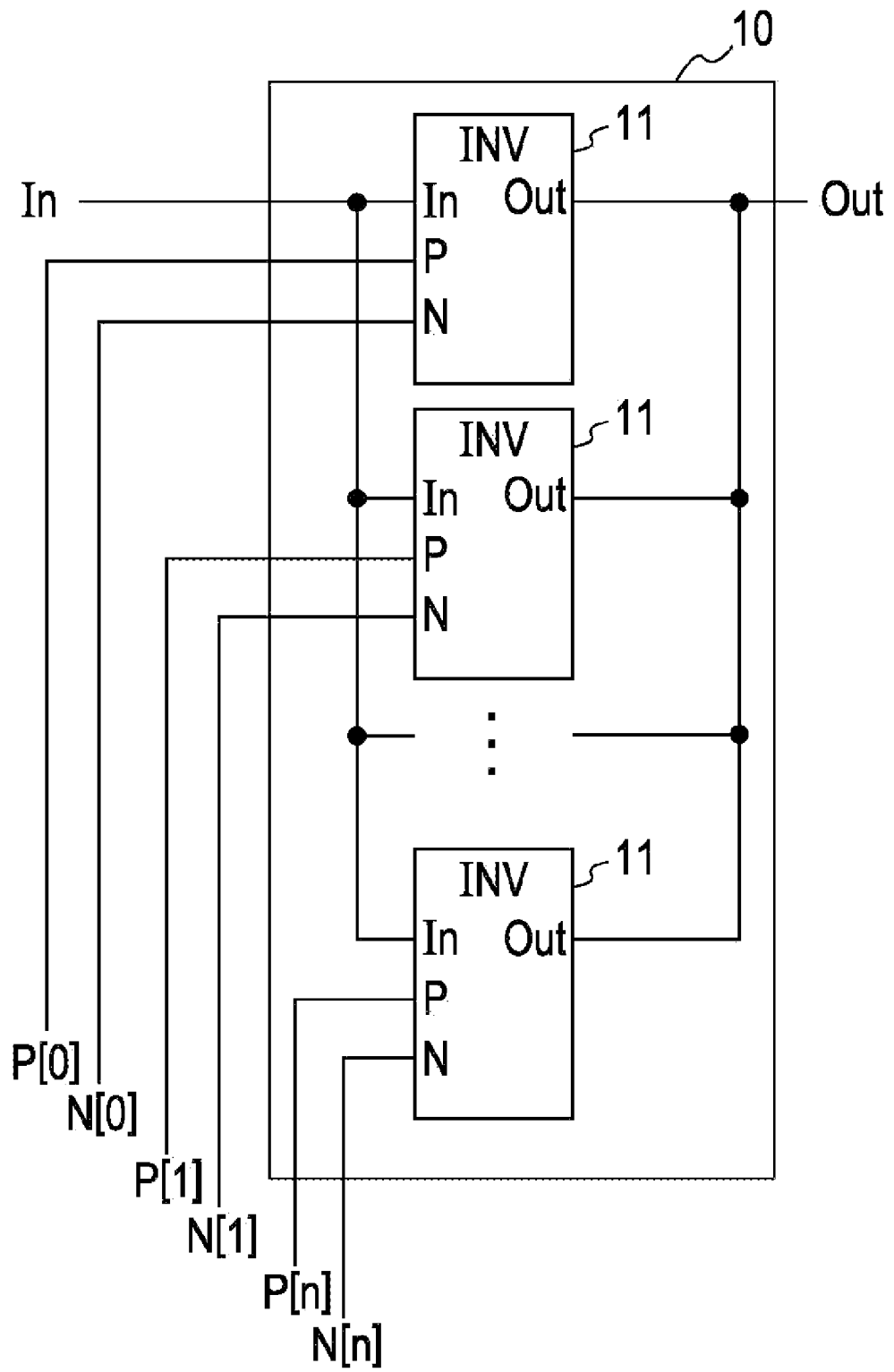
FIG. 3 is a configuration diagram exemplifying an inverter block according to embodiments.
Figure 4:
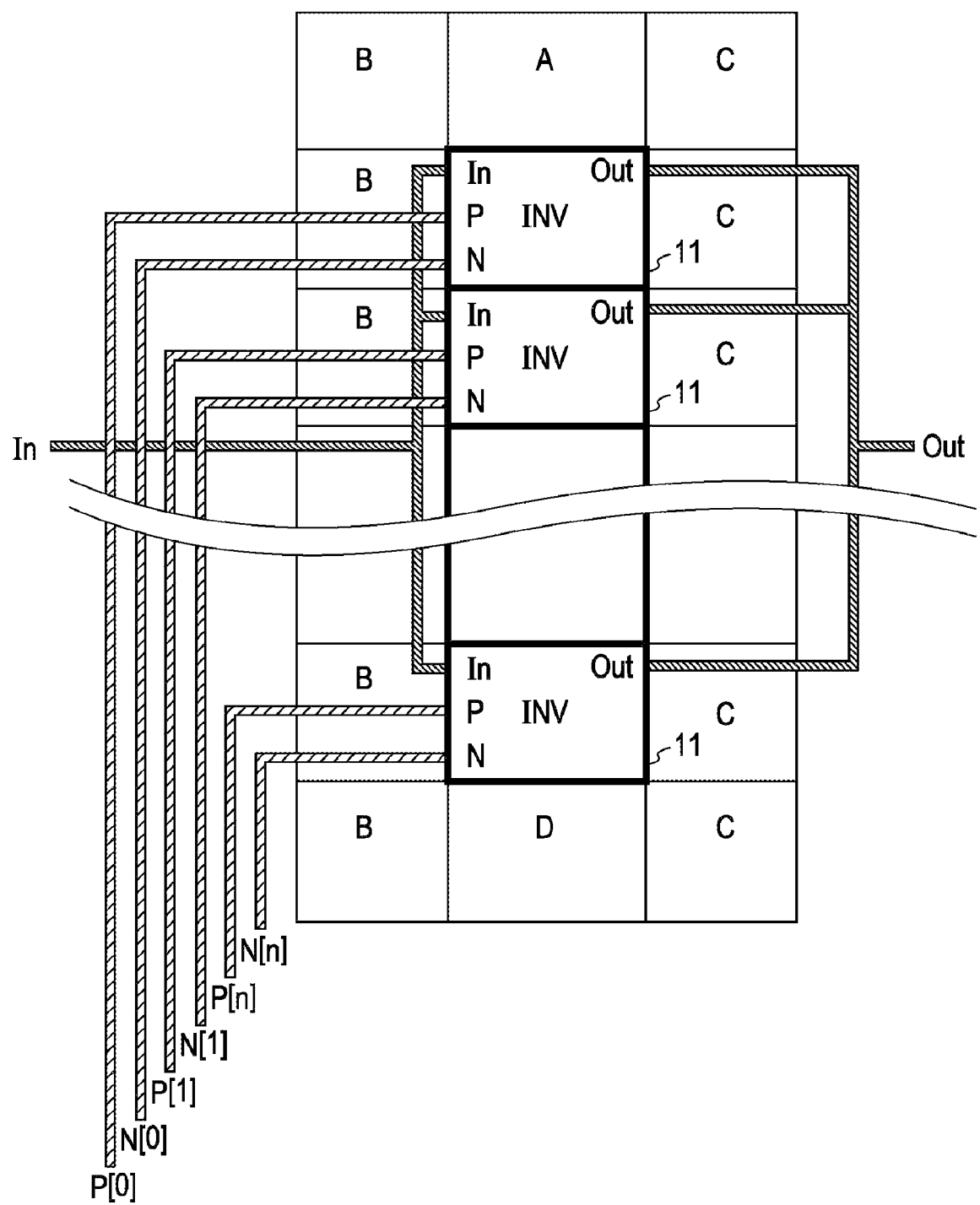
FIG. 4 is a diagram exemplifying an internal layout of the inverter block according to embodiments.

FIG. 4 illustrates an example of internal layout corresponding to the internal circuit configuration of the inverter block 10 illustrated in FIG. 3. As depicted in FIG. 4, the inverters 11 are arranged successively in a column direction inside the inverter block 10. Layout blocks (A, B, C, and D) are arranged for the inverters 11 so that the arrangement of each inverter becomes even layout. This is a step to minimize a change of transistor characteristics due to differences in a layout shape around transistors. For example, while the distance to adjacent gate-poly may affect exposure precision in an exposure process to form a gate-poly of an ultra-fine transistor, exposure precision can be maintained constant by typically having the same shape in the surroundings.

The layout block A illustrated in FIG. 4 makes an upper boundary layout of the top inverter 11 the same as a boundary layout of the intermediate inverter 11 by reproducing a lower transistor layout of the inverter 11. The layout blocks B and C make right and left boundary layouts of the inverter 11 the same for all inverters by being arranged on the right and left sides of the inverters 11. The layout block D makes the lower boundary layout of the bottom inverter 11 the same as the boundary layout of the intermediate inverter 11 by reproducing an upper transistor layout of the inverter 11.

Figure 5A:
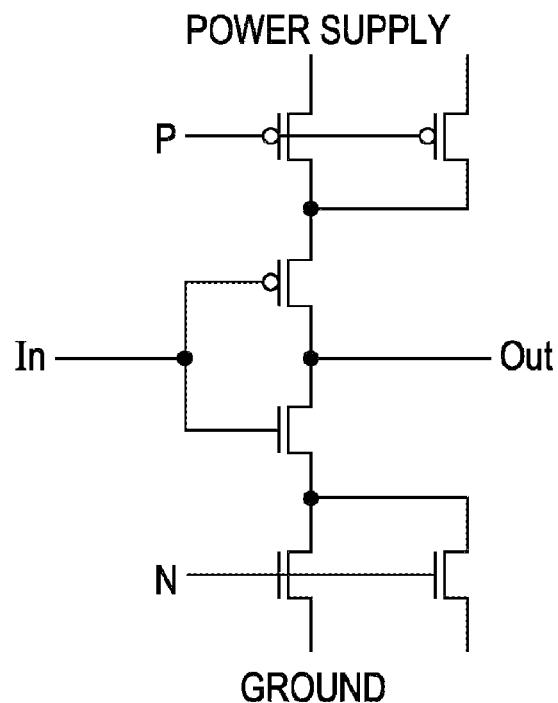
FIGS. 5A and 5B are diagrams exemplifying a circuit configuration of an inverter according to embodiments.
Figure 5B:
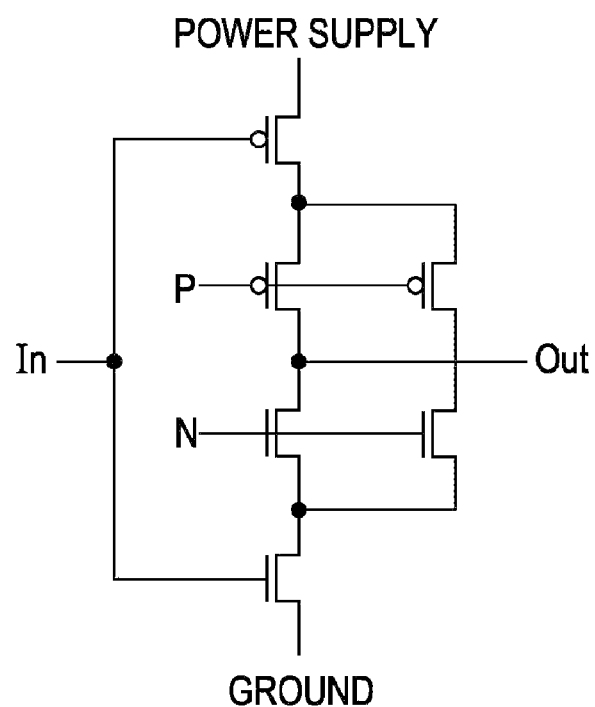

Next, FIGS. 5A and 5B exemplify the internal circuit configuration of the inverter 11. The inverter 11 illustrated in FIG. 5A has a configuration compared with an ordinary inverter in which switching transistors are inserted into portions connected to a power supply or ground of an inverter. That is, the inverter 11 has a configuration in which a power supply terminal is connected via a P-type transistor (a first power supply potential connection transistor, a second power supply potential connection transistor) and a ground terminal is connected via an N-type transistor (a first ground potential connection transistor, a second ground potential connection transistor). With this configuration, the power supply or ground can be connected and separated by a transistor switching signal (P, N) from the selector block 20 (shown in FIG. 2).

The P-type transistor and N-type transistor into which switching signals are input each includes a plurality of transistors to suppress fluctuations of each transistor and has a configuration in which these transistors are connected in parallel. Transistors in ordinary inverter components are transistors whose fluctuations to be evaluated. Because the P-type transistor and N-type transistor are switched independently, a state in which only one transistor (for example, the P-type transistor only) operates with the inverter 11 alone. However, in one stage of the inverter block 10 in which a plurality of the inverters 11 is connected in parallel as a whole, one stage of the inverter block 10 may have a function as an inverter by the other transistor (for example, the N-type transistor) being controlled to operate in another inverter.

FIG. 5B illustrates another circuit configuration example. FIG. 5B illustrates a configuration in which switching transistors (a P-type transistor and an N-type transistor) are inserted into a terminal of an output signal (Out) from an ordinary inverter configuration. With this configuration, an operation similar to that of the configuration in FIG. 5A can be performed.

Figure 6:
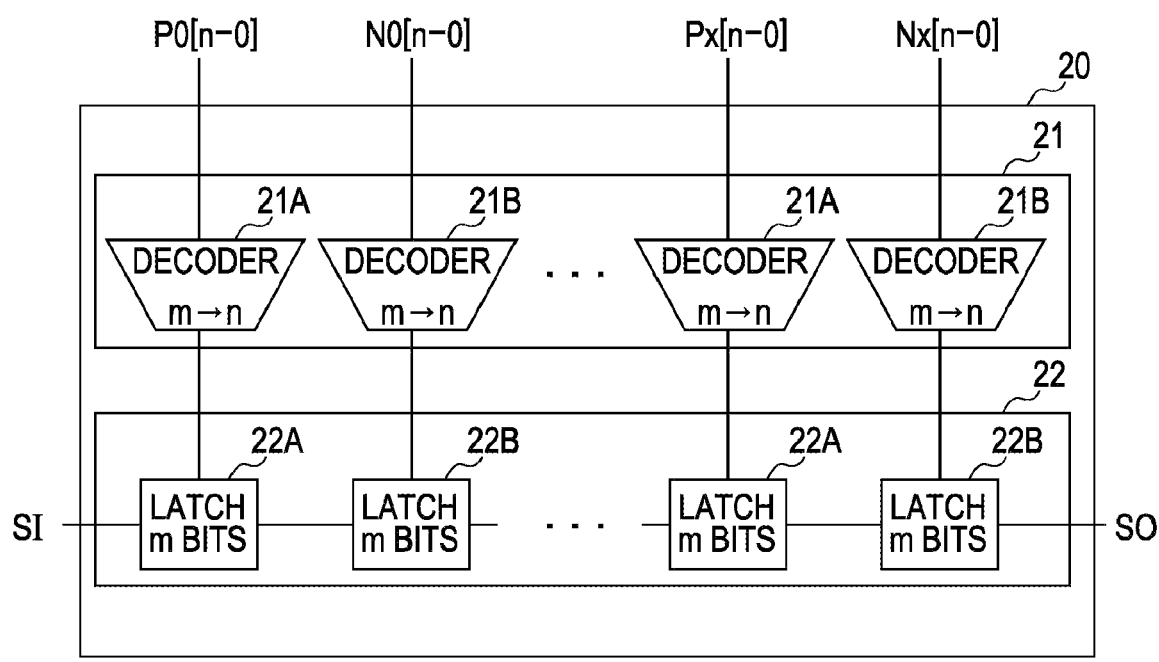
FIG. 6 is a diagram exemplifying the configuration of a selector block according to embodiments.

Next, FIG. 6 illustrates the internal configuration of the selector block 20. The selector block 20 outputs a transistor switching signal to one gate terminal of P-type transistors held by each of the plurality of the inverters 11. The selector block 20 also outputs a transistor switching signal to one gate terminal of N-type transistors held by each of the plurality of the inverters 11. The transistor switching signal output to the gate terminal of a P-type transistor is called a power supply potential connection signal and the power supply potential connection signal is output to the gate terminal of an N-type transistor a ground potential connection signal.

The selector block 20 is configured by a latch unit 22 holding transistor selection information being connected to a decoder unit 21. Transistor selection information held in the latch unit 22 is converted into a transistor switching signal by the decoder unit 21 before being output to each of the inverters 11. Transistor selection information is set to the latch unit 22 by scan-shift operation each time oscillation measurement is made. The selector block 20 outputs a transistor switching signal in such a way that only one decoder among a plurality of decoders has a different output value (that is "1-hot decode logic).

The decoder unit 21 includes a decoding circuit 21A for power supply potential connection signal generation that outputs a power supply potential connection signal to one gate terminal of P-type transistors included in each of the plurality of the inverters 11. The decoder unit 21 also includes a decoding circuit 21 B for ground potential connection signal generation that outputs a ground potential connection signal to one gate terminal of N-type transistors included in each of the plurality of the inverters 11.

The latch unit 22 includes a latch circuit 22A (first latch circuit) that outputs transistor selection information (called as a power supply potential connection setting signal), which is a connection/separation setting signal, to the decoding circuit 21A for power supply potential connection signal generation, The latch unit 22 also includes a latch circuit 22B (second latch circuit) that outputs transistor selection information (called as a ground potential connection setting signal), which is a connection/separation setting signal, to the decoding circuit 21 B for ground potential connection signal generation.

The latch unit 22 is a scan latch constituting a scan chain with a power supply potential connection setting signal set to the latch circuit 22A by scan-shift operation and a ground potential connection setting signal also set to the latch circuit 22B by scan-shift operation.

Figure 7:
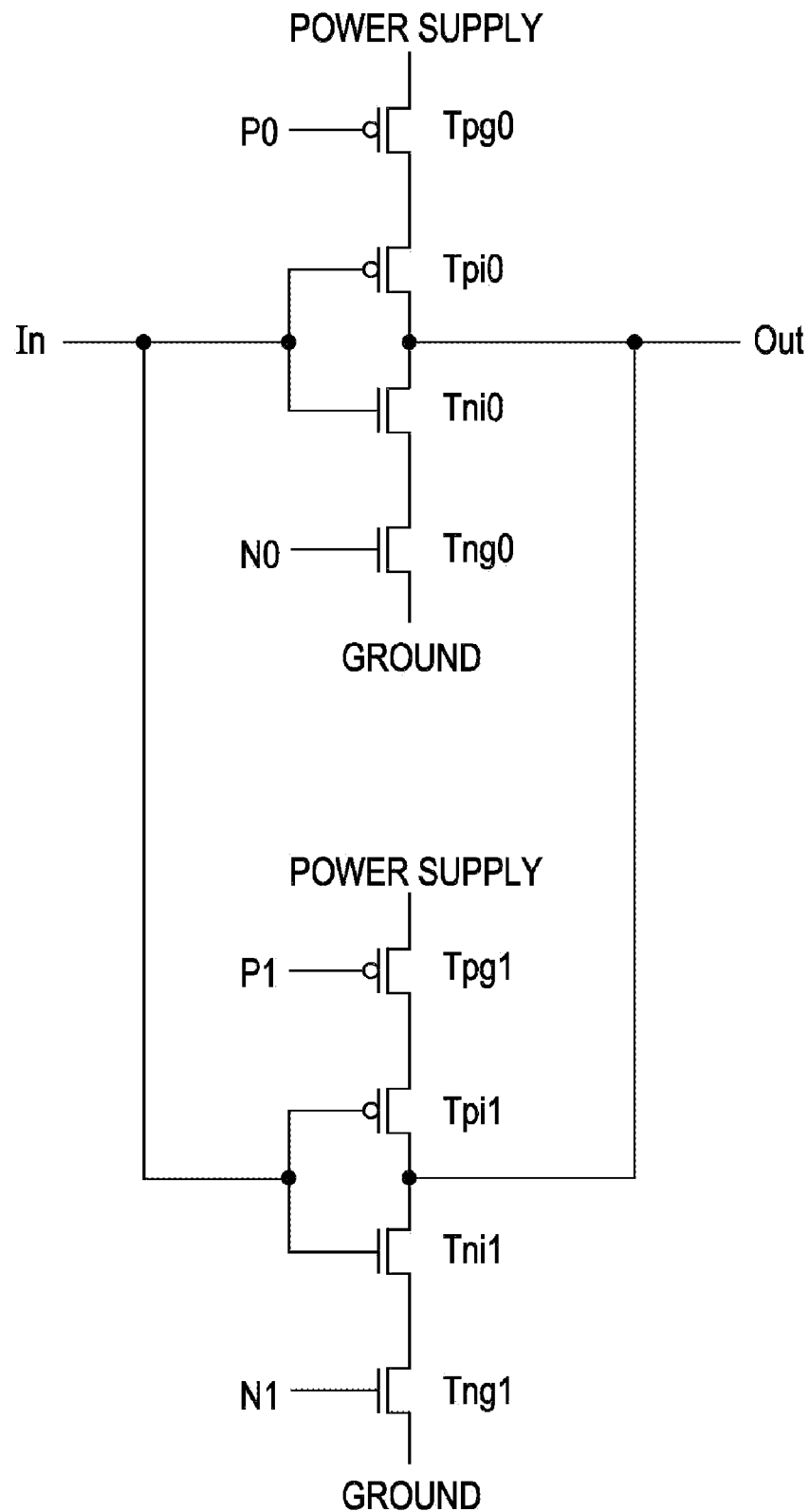
FIG. 7 is a diagram exemplifying the minimum circuit configuration of the inverter block according to embodiments.

Next, FIG. 7 illustrates an example of minimum internal circuit configuration of the inverter block 10. An input signal (In) is connected to gates of four transistors Tpi0, Tni0, Tpi1, and Tni1 whose fluctuations to be measured and drains of the four transistors are each connected to the output signal (Out). Switching transistors Tpg0 and Tpg1 are inserted between the power supply and Tpi0 and between the power supply and Tpi1 respectively and switching transistors Tng0 and Tng1 are inserted between the ground and Tni0 and between the ground and Tni1 respectively so that the transistor to be measured is selectively activated by signals P0, N0, P1, and N1 respectively.

Tpi0, Tpg0, Tpi1, and Tpg1 are P-type transistors and Tni0, Tng0, Tni1, and Tng1 are N-type transistors.

Next, a selection method of transistors and an example of technique to determine a difference of transistor performance will be described.

First, a signal set for the inverter 11 is output from the selector block 20 after the selector block to being set as P0=0, N0=1, P1=1, and N1=0 (setting step).

With settings as described above, an oscillating frequency (here, set as an oscillating frequency A) using Tpi0 and Tni0 is determined. Next, with P0=1, N0=1, P1=0, and N1=0, an oscillating frequency (here, set as an oscillating frequency B) using Tpi1 and Tni1 is determined (measurement step).

A frequency difference between the oscillating frequency A and the oscillating frequency B results from a difference of transistor performance of Tpi0 and Tpi1. Thus, by determining a difference between the oscillating frequency A and the oscillating frequency B, a difference of transistor performance (delay difference) between Tpi0 and Tpi1 can be calculated (calculation step).

Similarly, assuming that P0=0, N0=0, P1=1, and N1=1, an oscillating frequency C is determined using Tpi0 and Tni1. Accordingly, a difference of transistor performance between Tni0 and Tni1 appears as a frequency difference between A and C. While two inverters are used for measurement in this example, fluctuations in a chip by transistor can be determined by making such frequency measurements using many transistors.

Figure 8:
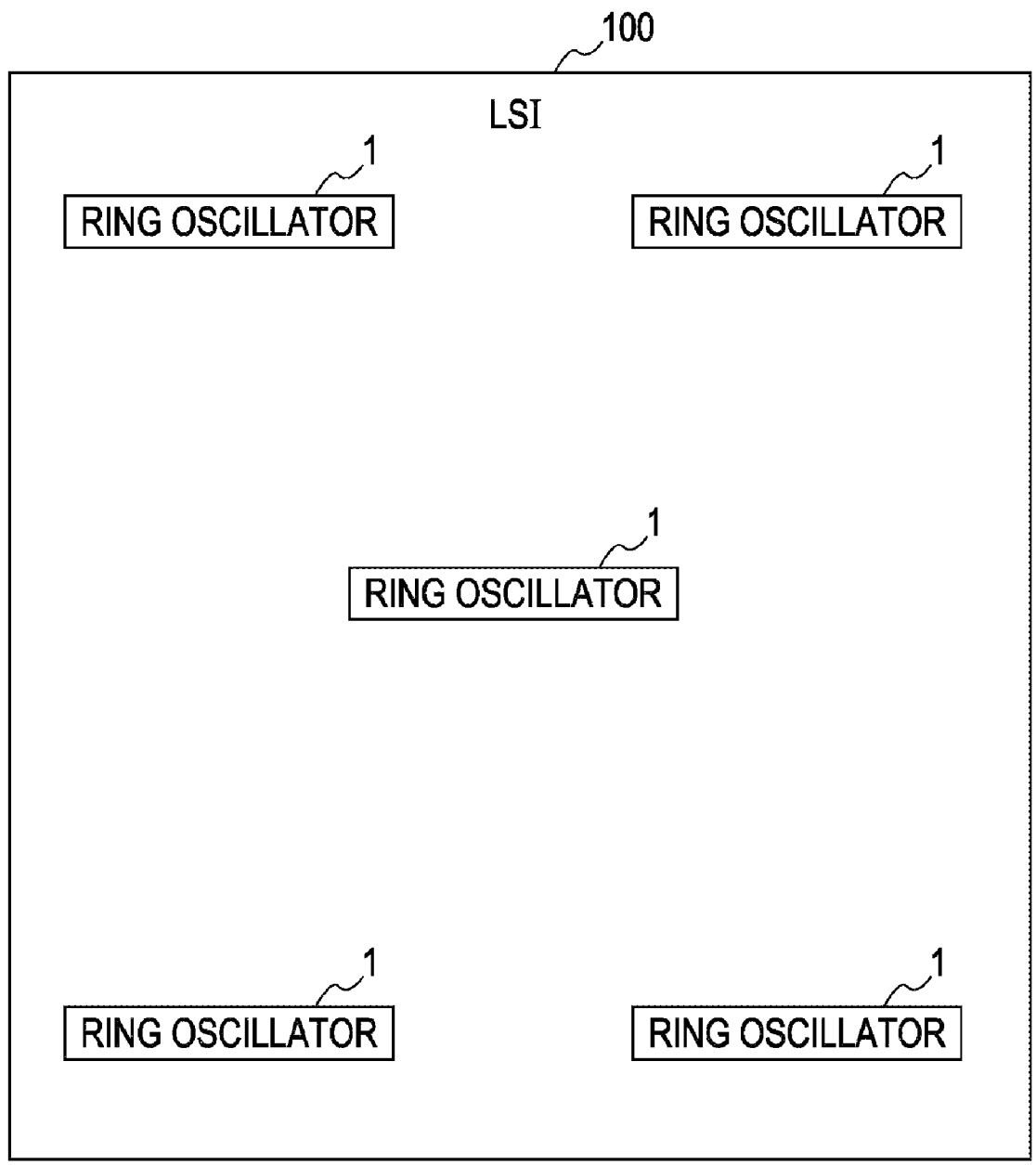
FIG. 8 is a diagram illustrating a LSI equipped with ring oscillators according to embodiments.
Figure 9A:
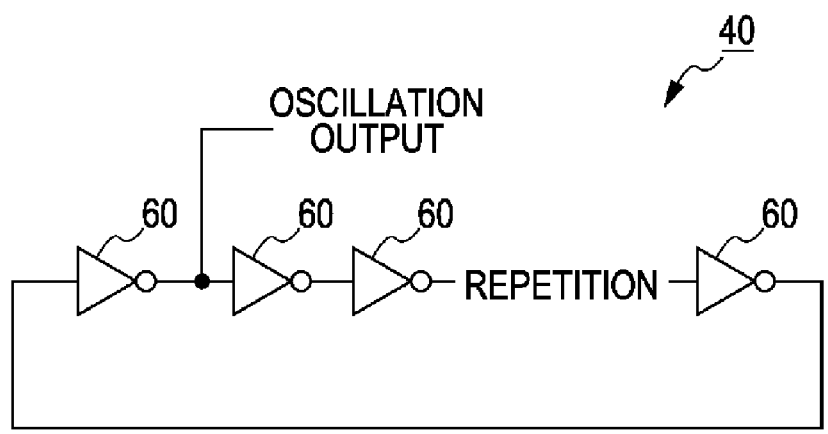
FIGS. 9A and 9B are diagrams illustrating the configuration of a conventional ring oscillator.
Figure 9B:
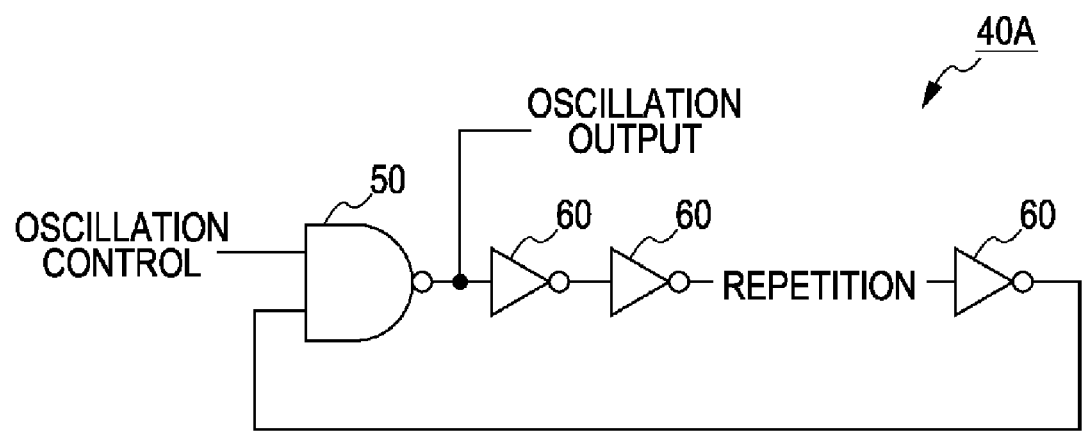
Figure 10:
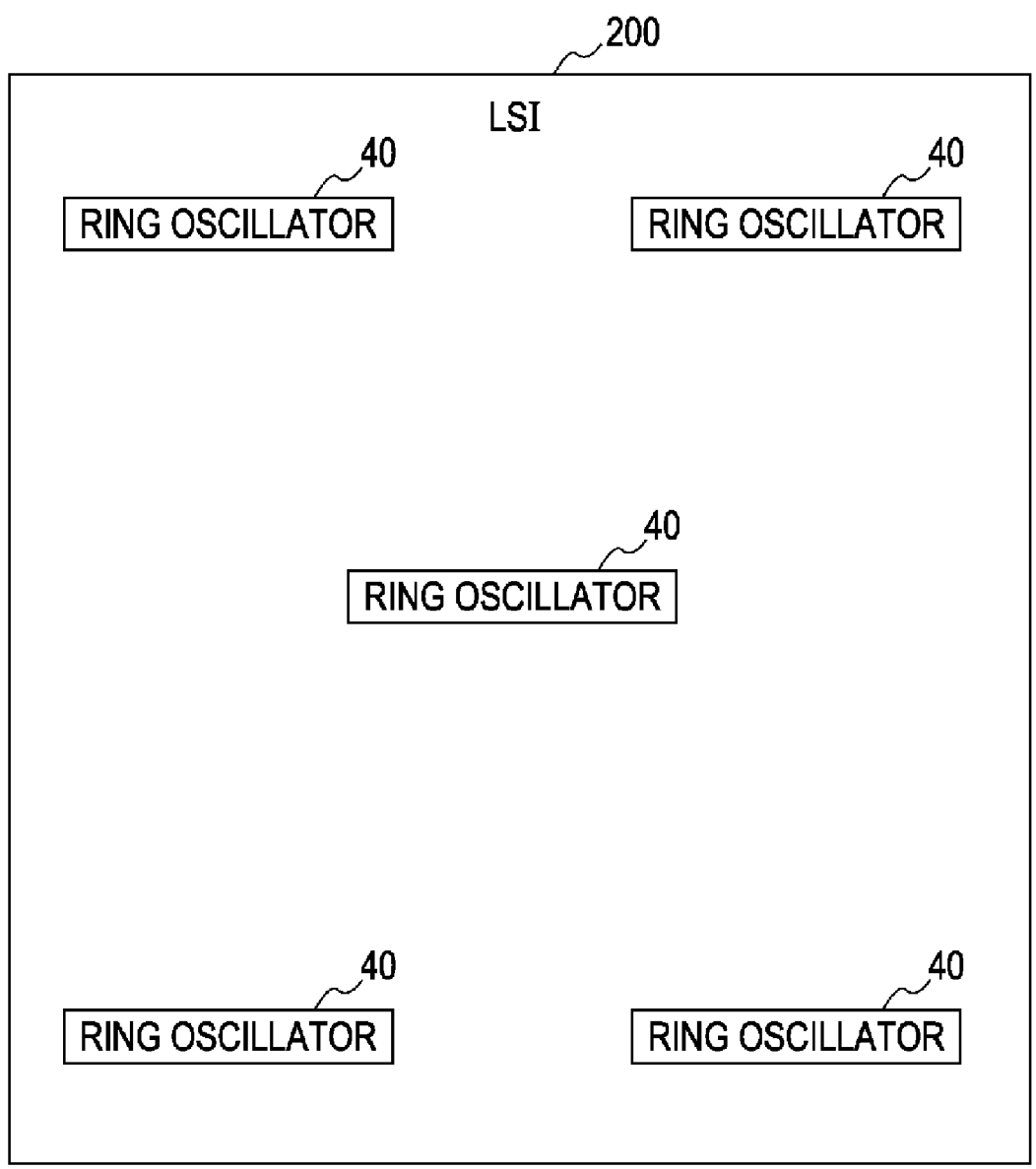
FIG. 10 is a diagram illustrating a LSI equipped with conventional ring oscillators.

Lastly, FIG. 8 illustrates an example when the ring oscillators 1 are arranged in a LSI. A semiconductor circuit apparatus having the ring oscillators 1 can be provided by mounting and arranging the same ring oscillator 1 at locations in a LSI 100 considered necessary for measurement, as depicted in FIG. 8

With latest information about fluctuations in a chip collected swiftly thanks to the present embodiment, the latest information about fluctuations in a chip can be incorporated into designing, whereby improvement of yields of chip by prevention of margin shortages and improvement of performance due to reduction of excessive design margins can be achieved.

Although a few preferred embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A semiconductor circuit apparatus having a clock oscillating circuit comprising:
    a first inverter circuit having a power supply terminal connected to a power supply potential via a first power supply potential connection transistor and a ground terminal connected to a ground potential via a first ground potential connection transistor;
    a second inverter circuit connected to the power supply potential via a second power supply potential connection transistor and to the ground potential via a second ground potential connection transistor, the second inverter circuit being electrically connected to the first inverter circuit in parallel; and
    a selection circuit block that is configured to independently turn on any one of the first and second power supply potential connection transistors by outputting a power supply potential connection signal to any one of gate terminals of the first and second power supply potential connection transistors and to independently turn on any one of the first and second ground connection transistors by outputting a ground potential connection signal to any one of gate terminals of the first and second ground potential connection transistors.

2. The semiconductor circuit apparatus according to claim 1, wherein the selection circuit block comprises:
    a first decoding circuit that generates the power supply potential connection signal to any one of gate terminals of the first and second power supply potential connection transistors;
    a second decoding circuit that generates the ground potential connection signal to any one of gate terminals of the first and second ground potential connection transistors;
    a first latch circuit that outputs a power supply potential connection setting signal to the first decoding circuit; and
    a second latch circuit that outputs a ground potential connection setting signal to the second decoding circuit.

3. The semiconductor circuit apparatus according to claim 2, wherein the first and second latch circuits are scan latches constituting a scan chain and
    the power supply potential connection setting signal is set to the first latch circuit by a scan-shift operation and the ground potential connection setting signal is set to the second latch circuit by scan-shift operation.

4. The semiconductor circuit apparatus according to claim 1, wherein the clock oscillating circuit has odd inverter circuit blocks connected in a ring shape by an output terminal of any one inverter circuit block being connected to an input terminal of any other inverter circuit block and outputs a clock from the output terminal of any one inverter circuit block of the odd inverter circuit blocks connected in the ring shape.

5. The semiconductor circuit apparatus according to claim 4, wherein the clock oscillating circuit further comprises:
    a NAND circuit, wherein
    the output terminal of a first inverter circuit block is connected to the input terminal of the NAND circuit and a clock oscillation inhibition signal is connected to the other input terminal of the NAND circuit, the output terminal of the NAND circuit is connected to the input terminal of a second inverter circuit block and the output terminal of any one inverter circuit block excluding the first inverter circuit block is connected to the input terminal of any one inverter circuit block excluding the second inverter circuit block, and the odd inverter circuit blocks and the NAND circuit are connected in the ring shape to output the clock from the output terminal of the NAND circuit.

6. The semiconductor circuit apparatus according to claim 5, wherein the clock oscillating circuit further comprises a clock oscillation inhibition signal setting latch circuit that outputs the clock oscillation inhibition signal.

7. The semiconductor circuit apparatus according to claim 1, wherein the first and the second power supply potential connection transistors are P-type transistors and the first and the second ground potential connection transistors are N-type transistors.

8. A semiconductor circuit apparatus having a clock oscillating circuit comprising:
    a first inverter circuit having a first P-type transistor whose power supply terminal is connected to a power supply potential and to an output terminal via a first switching transistor and a first N-type transistor whose power supply terminal is connected to a ground potential and to the output terminal via a second switching transistor;
    a second inverter circuit having a second P-type transistor whose power supply terminal is connected to the power supply potential and to the output terminal via a third switching transistor and a second N-type transistor whose power supply terminal is connected to the ground potential and to the output terminal via a fourth switching transistor, the second inverter circuit being electrically connected to the first inverter circuit in parallel; and
    a selection circuit block that is configured to independently turn on any one of the first and second switching transistors by outputting a power supply potential connection signal to any one of gate terminals of the first and second switching transistors and to independently turn on any one of the third and fourth switching transistors by outputting a ground potential connection signal to any one of gate terminals of the third and fourth switching transistors.

9. A delay difference calculation method of a clock oscillating circuit including a plurality of inverter circuit blocks arranged in a ring shape in such a way that a clock is output to an outside, each of the inverter circuit block including a first inverter circuit and a second inverter circuit connected to the first inverter circuit in parallel, the first inverter circuit including a power supply terminal connected to a power supply potential via a first power supply potential connection transistor and a ground terminal connected to a ground potential via a first ground potential connection transistor, and the second inverter circuit connected to the power supply potential via a second power supply potential connection transistor and to the ground potential via a second ground potential connection transistor; the delay difference calculation method comprising:
    setting the clock oscillating circuit so that a power supply potential connection signal is output to any one of gate terminals of the first and second power supply potential connection transistors and a ground potential connection signal is output to any one of gate terminals of the first and second ground potential connection transistors;

performing the setting a plurality of times to create a plurality of patterns from output of the power supply potential connection signal and the ground potential connection signal;

measuring oscillating frequencies of the clock oscillated from the clock oscillating circuit; and calculating a delay difference of each of transistors constituting the first inverter circuit and transistors constituting the second inverter circuit based on differences of respective oscillating frequencies measured in the measuring.

* * * * *